United States Patent [19]

Mantani

[11] 4,233,874

[45] Nov. 18, 1980

[54] FREQUENCY CONVERSION SYSTEM OF TONE SIGNAL PRODUCED BY ELECTRICALLY PICKING UP MECHANICAL VIBRATION OF MUSICAL INSTRUMENT

[75] Inventor: Rokurota Mantani, Hamamatsu, Japan

[73] Assignee: Nippon Gakki Seizo Kabushiki Kaisha, Hamamatsu, Japan

[21] Appl. No.: 22,104

[22] Filed: Mar. 20, 1979

[30] Foreign Application Priority Data

| | | | |
|---|---|---|---|
| Mar. 25, 1978 | [JP] | Japan | 53-34539 |
| Mar. 25, 1978 | [JP] | Japan | 53-34540 |
| Mar. 25, 1978 | [JP] | Japan | 53-34541 |
| Mar. 25, 1978 | [JP] | Japan | 53-34542 |
| Jun. 13, 1978 | [JP] | Japan | 53-71270 |

[51] Int. Cl.[3] .......... G10H 1/06; H03C 1/00; H03B 21/00

[52] U.S. Cl. .......... 84/1.23; 84/1.01; 84/1.2; 84/445; 332/2; 332/31 R; 331/37

[58] Field of Search .......... 84/DIG. 18, DIG. 21, 84/DIG. 24, 1.2, 445, 1.01, 1.23; 332/31 R, 2, 40, 41; 331/37-40, 43

[56] References Cited

U.S. PATENT DOCUMENTS

| | | | |
|---|---|---|---|
| Re. 26,533 | 3/1969 | Cookerly et al. | 84/1.16 |
| 2,773,179 | 12/1956 | Makow | 331/37 |
| 3,000,252 | 9/1961 | Wayne | 84/1.2 |
| 3,006,228 | 10/1961 | White | 84/1.01 |
| 3,320,546 | 5/1967 | Allen et al. | 331/38 |
| 3,429,976 | 2/1969 | Tomcik | 84/1.12 |
| 3,532,799 | 10/1970 | Kameoka et al. | 84/1.23 |
| 3,605,023 | 9/1971 | Kline | 331/37 |
| 3,637,913 | 1/1972 | Evans | 84/1.01 |
| 3,651,242 | 3/1972 | Evans | 84/1.19 |
| 3,711,617 | 1/1973 | Evans | 84/DIG. 24 |
| 3,716,647 | 2/1973 | Kameoka | 84/1.11 |
| 3,762,265 | 10/1973 | Adachi | 84/1.01 |
| 3,857,997 | 12/1974 | Toonder | 331/38 |
| 4,019,419 | 4/1977 | Yoshikawa et al. | 84/454 |
| 4,105,949 | 8/1978 | Hardin | 331/37 |
| 4,160,402 | 7/1979 | Schwartz | 84/1.24 |
| 4,168,645 | 9/1979 | Squire et al. | 84/1.01 |

*Primary Examiner*—J. V. Truhe
*Assistant Examiner*—Forester W. Isen
*Attorney, Agent, or Firm*—Frishauf, Holtz, Goodman & Woodward

[57] ABSTRACT

An octave conversion system of the fundamental frequency of an audible tone signal produced by electrically picking up mechanical vibration of a musical instrument in which the audible tone signal and an audible modulation signal having a frequency in a preselected relation to the fundamental frequency of the tone signal are applied to a multiplier which is preferably constituted by a voltage-controlled amplifier. When the modulation signal has a frequency half that of the tone signal, the tone signal is one-octave down-converted, while, when the modulation frequency is equal to the tone signal frequency the tone signal is one-octave up-converted. With this frequency conversion system the fundamental wave component of the octave-converted tone signal has the same envelope as that of the original tone signal. This frequency conversion system is advantageous in attaining small size versions of electric musical instruments and extension of inherent compasses of electric musical instruments.

16 Claims, 18 Drawing Figures

FIG. 8
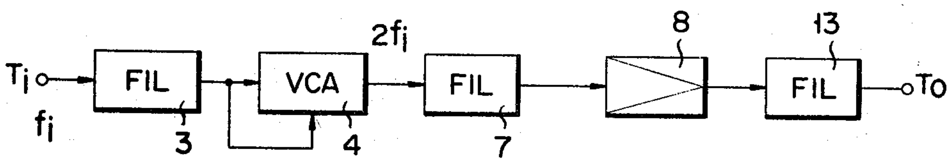
FIG. 9
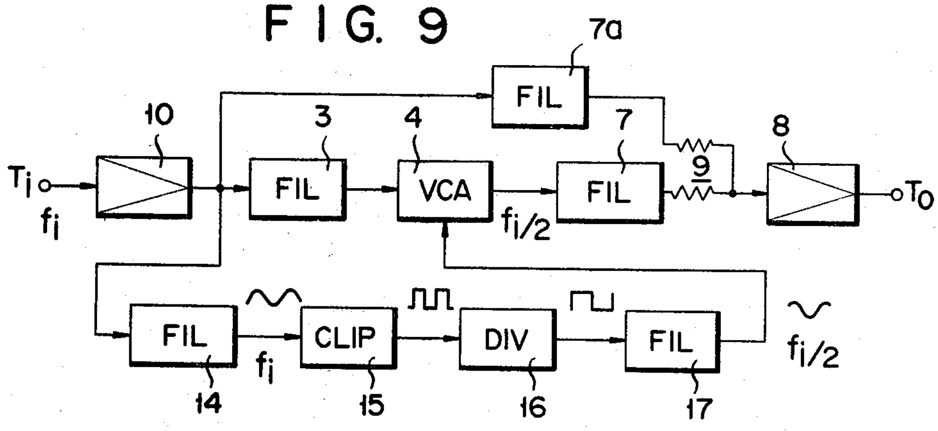
FIG. 10
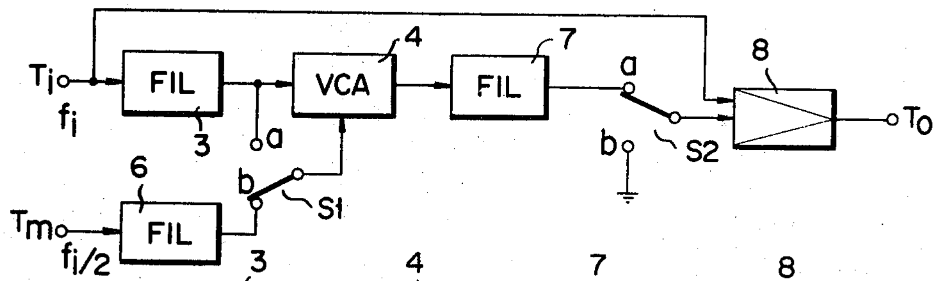
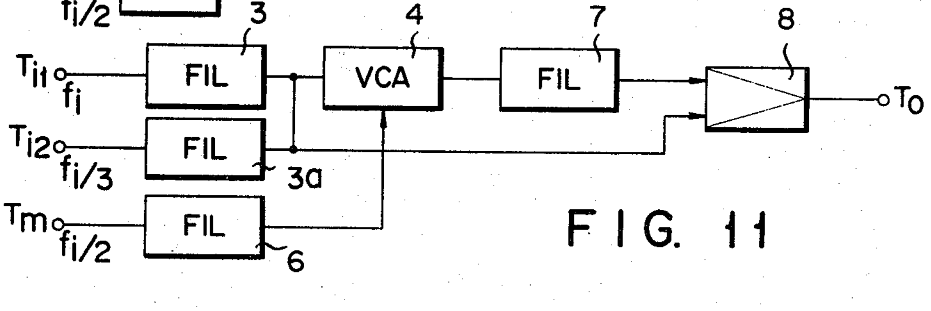
FIG. 11

FREQUENCY CONVERSION SYSTEM OF TONE SIGNAL PRODUCED BY ELECTRICALLY PICKING UP MECHANICAL VIBRATION OF MUSICAL INSTRUMENT

BACKGROUND OF THE INVENTION

This invention relates to a frequency conversion system and more particularly to a system for converting the frequency of a musical tone signal obtained by electrically picking up mechanical vibration of a musical instrument.

In addition to an electronic musical instrument such as an electronic organ for producing tone signals through electronic circuits, an electric musical instrument such as an electric piano and electric guitar is also widely used to electrically pick up mechanical vibration of vibration pieces or strings of the musical instrument to produce tone signals. The electric piano, together with the electric guitar etc., is often used in light music concerts frequently held at local or provincial areas and for this reason it is preferred that it be compact enough for a musician to carry. A compact electric piano can be attained by reducing the number of strings and keys, but this reduces the number of sound sources, narrowing the compass of the electric piano. An octave conversion system may be used to cover a wider compass in a compact electric piano. This system is used to further lower by octave or octaves, as required, the frequency of tone signals belonging to the lowest octave of the electric piano. The use of the octave conversion system permits a compact keyboard and/or a compact frame for supporting mechanical vibration pieces or strings without narrowing the compass of the musical instrument. In this case, since tone signals of different frequencies can be obtained from a common string or different strings of equal size, a compact keyboard and/or compact frame can be used.

As a frequency or octave conversion system a so-called octave box is conventionally used, in which original tone signals obtained by electrically detecting the mechanical vibrations of the strings are supplied to a lowpass filter to provide a sinusoidal wave signal of the fundamental frequency of the tone signal, and such a sinusoidal wave signal is converted by a clipper circuit to a rectangular wave signal. The rectangular wave signal is frequency-divided by a factor of 2, for example, and the frequency-divided rectangular wave is filtered out by a lowpass filter so as to produce a sinusoidal wave signal. The envelope of the original tone signal is extracted by an envelope detector to produce an envelope signal. The sinusoidal wave signal having a frequency of one half of the fundamental frequency of the tone signal is furnished with the envelope by a voltage-controlled amplifier responsive to the envelope signal. The output signal of the voltage-controlled amplifier and original tone signal are mixed by a mixer so as to produce an one-octave lower tone signal. The harmonic components of the one-octave lower tone signal consists of the fundamental frequency component of the original tone signal and its harmonic components.

Such frequency or octave conversion system is complicated in its arrangement and it is difficult to accurately extract the envelope of the original tone signals over the whole range of the fundamental frequency. That is, it is difficult to effect a frequency conversion without changing the original envelope.

SUMMARY OF THE INVENTION

It is an object of this invention to provide a frequency conversion system for use with musical instruments which is simple in construction and can faithfully reproduce envelopes of tone signals obtained by electrically picking up mechanical vibration of the musical instrument.

In accordance with this invention, an audible tone signal obtained by electrically picking up mechanical vibration of a musical instrument and an audible modulation signal having a frequency in a preselected relation to the fundamental frequency fi of the audible tone signal are applied to a multiplier.

The multiplier produces an output tone signal having the fundamental frequency of m/nfi (m, n are natural numbers). For example, the modulation signal frequency is $\frac{1}{2}$fi, the tone signal is one-octave down-converted so that the fundamental frequency of the output tone signal becomes $\frac{1}{2}$fi. When the modulation frequency is fi the tone signal is one-octave up-converted so that the fundamental frequency of the output tone signal becomes 2fi.

As the multiplier, a voltage-controlled amplifier may be used. In this case, part of input tone signal appears on the output of voltage-controlled amplifier without being frequency-converted.

The input tone signal may be mixed with the frequency-converted output tone signal as required.

The modulation signal may be formed of the input tone signal.

A plurality of modulation signals of different frequencies may be selectively applied to the multiplier.

An envelope signal may be formed of the input tone signal which decays faster than the envelope of the mental wave component of the input tone signal, and applied to the multiplier together with the modulation signal so that overtone components contained in the downwardly frequency-converted output tone signal decay faster than the fundamental tone component, obtaining a natural tone color.

BRIEF DESCRIPTION OF THE DRAWINGS

FIGS. 8 to 14 show block diagrams of other embodiments of this invention;

DESCRIPTION OF THE PREFERRED EMBODIMENTS

Figure 1:
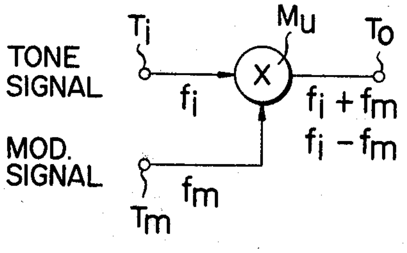
FIGS. 1 and 2 show basic arrangements of the frequency conversion system of this invention.

In FIG. 1 showing a basic arrangement of this invention, Ti designates an input terminal for receiving an original audible tone signal which is produced by electrically picking up mechanical vibration of a sound generating unit of a musical instrument, and Tm designates an input terminal for receiving a modulation signal having a frequency, an audible frequency in many cases, in a preselected relation to the fundamental frequency of the tone signal applied to the input terminal Ti. The tone signal and the modulation signal are applied to a multiplier Mu so that the tone signal is multiplied by the modulation signal. Due to multiplication by means of the multiplier Mu a frequency-converted tone signal appears on an output terminal To.

Assuming that the tone signal is sin 2πfit and the modulation signal is sin 2πfmt, the output tone signal is given by $$\sin 2\pi fit \times \sin 2\pi fmt = \frac{1}{2}\{\cos 2\pi(fi+fm)t - \cos 2\pi(fi-fm)t\},$$

where fi is the frequency of the tone signal and fm is the frequency of the modulation signal. As will be evident from the above equation, the frequency-converted tone signal consists of frequency components of (fi+fm) and (fi−fm). Moreover, the output tone signal has the same envelope as the original tone signal which has been electrically picked up.

Figure 2:
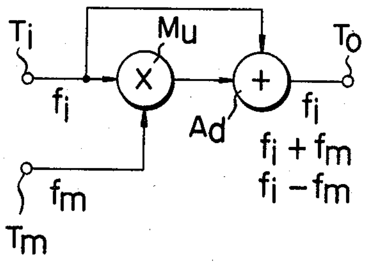

FIG. 2 shows another basic arrangement in which the modulated tone signal from the multiplier Mu and the original tone signal are combined in an adder Ad. Accordingly, the output tone signal at the output terminal To is represented by $$\sin 2\pi fit \times \sin 2\pi fmt + \sin 2\pi fit = \frac{1}{2}\{\cos 2\pi(fi+fm)t - \cos 2\pi(fi-fm)t\} + \sin 2\pi fit$$

The arrangement of FIG. 2 is suited for the case where it is required that the frequency of the original tone signal be contained in the output tone signal.

Figure 3:
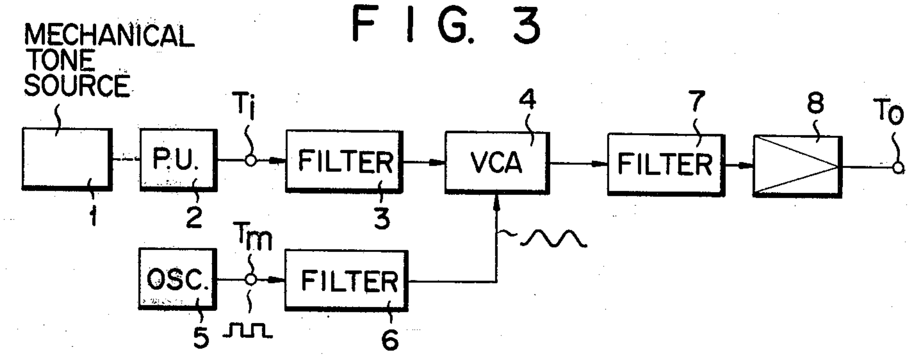
FIGS. 3 and 4 show practical arrangements corresponding to the arrangements of FIGS. 1 and 2, respectively.

In FIG. 3 showing a practical arrangement corresponding to the basic arrangement of FIG. 1, a mechanical tone source 1 such as a string or vibration piece in an electrical piano and a suitable electrical pick-up 2 are coupled such that mechanical vibration of the string struck by a hammer upon depression of an associated key is electrically picked up by the pick-up 2 to produce an electrical audible tone signal. The tone signal is applied to a filter 3 where a desired frequency component is enhanced. The filtered tone signal from the filter 3 is applied to an input terminal of a voltage-controlled amplifier (VCA)4. An oscillation circuit 5 produces a modulation signal which may have a rectangular waveform. The modulation signal is applied to a filter 6 where its unwanted hamonic components are eliminated to form a substantially sinusoidal modulation signal. The sinusoidal modulation signal is applied to a control input of VCA4 so that the tone signal is multiplied by the modulation signal. Since VCA4 has such an electrical property as to pass part of an input signal, part of the tone signal from the filter 3 appears at the output of VCA4 without being frequency-converted. The output signal of VCA4 is fed to the output terminal To through a filter 7 and amplifier 8. The frequency characteristics of filters 3 and 7 are selected so that the output signal at the output terminal To may have a desired frequency spectrum.

Assuming that VCA4 has such an electrical characteristic as $$Vo = A\,Vi$$

$$A = a(Vm + C)$$

where Vo=an output voltage (output tone signal), Vi=an input voltage (input tone signal), A=an amplification, Vm=a control voltage (modulation signal), C=a bias voltage, and a=a constant, and that the input voltage Vi and the control voltage Vm are $$Vi = E(t)\sin 2\pi fit$$

$$Vm = \sin 2\pi fmt$$

where E(t)=an envelope function, the output voltage Vo is given by $$\begin{aligned} Vo &= a(Vm + C) \times Vi = a\{E(t)\cdot\sin 2\pi fmt \times \sin 2\pi fit + C\cdot E(t)\cdot\sin 2\pi fit\} \\ &= \frac{a\cdot E(t)}{2}\{\cos 2\pi(fm+fi)t - \cos 2\pi(fm-fi)t + 2C\cdot\sin 2\pi fit\} \end{aligned} \quad (1)$$

Accordingly, it will be understood that the output voltage Vo contains frequency components of (fm+fi), (fm−fi) and fi and has the same envelope as the input voltage Vi.

When the frequencies fi and fm of the tone signal and the modulation signal are set such that fm=½fi, the output signal Vo contains, as will be evident from the above equation (1), frequency components of 3/2fi, ½fi and fi.

Accordingly, the input tone signal is one-octave down-converted with the result that the fundamental frequency of the output tone signal becomes ½fi one-octave lower than that of the input signal. When fm=¾fi, the fundamental frequency of the output tone signal becomes ¼fi two-octaves lower than the fundamental frequency of the input tone signal. When fm=fi the input tone signal is one-octave up-converted so that the fundamental frequency of the output tone signal becomes 2fi one-octave higher than that of the input tone signal. When both the input voltage and control voltage have a plurality of harmonic components, the output voltage contains a number of harmonic components corresponding to the harmonic components of the input and control voltages.

The fundamental frequency of the input tone signal and the modulation signal frequency are not necessarily required to be completely harmonically related to each other. When $$fm = \frac{fi}{2} + \Delta f,$$

for example, the output voltage Vo will be as follows:

$$Vo = \frac{a\cdot E(t)}{2}\{\cos 2\pi(\tfrac{3}{2}fi + \Delta f)t - \cos 2\pi(\tfrac{fi}{2} - \Delta f)t + 2C\cdot\sin 2\pi fit\}$$

Namely, the frequency component of ½fi is slightly lowered, while the frequency component of 3/2fi is slightly raised with the result that the tuning curve characteristic of a piano can be obtained approximately.

Figure 4:
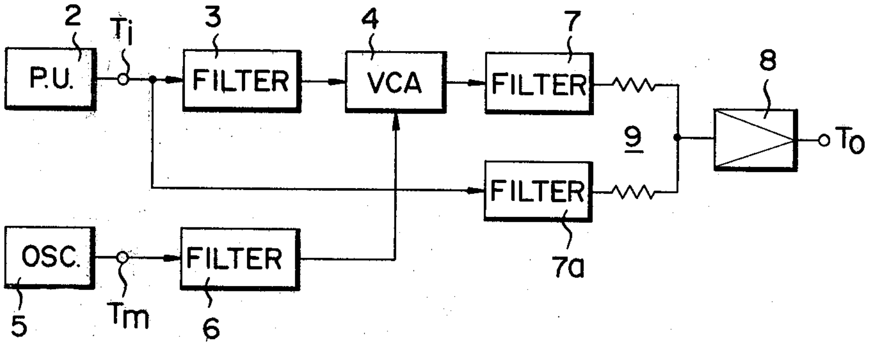

FIG. 4 shows a practical arrangement corresponding to the arrangement of FIG. 2, the same parts as those of FIG. 3 being denoted by like reference numerals. With this arrangement, the original input tone signal is applied to a filter 7a where its harmonic components are eliminated, and the output signals of the filters 7 and 7a are mixed together in a mixer 9, comprised of mixing resistors, prior to application to the amplifier 8. The arrangement of FIG. 4 is effectively used in the case where the amplitude of the fundamental wave component of the input tone signal at the output of VCA4 is undesirably small in the octave down-conversion.

In the arrangements of FIGS. 3 and 4, as the multiplier, a ring modulator may be used in place of VCA4. It should be noted, however, that the fundamental wave component of the input tone signal cannot appear, unlike VCA, at the output of the ring modulator.

Figure 5:
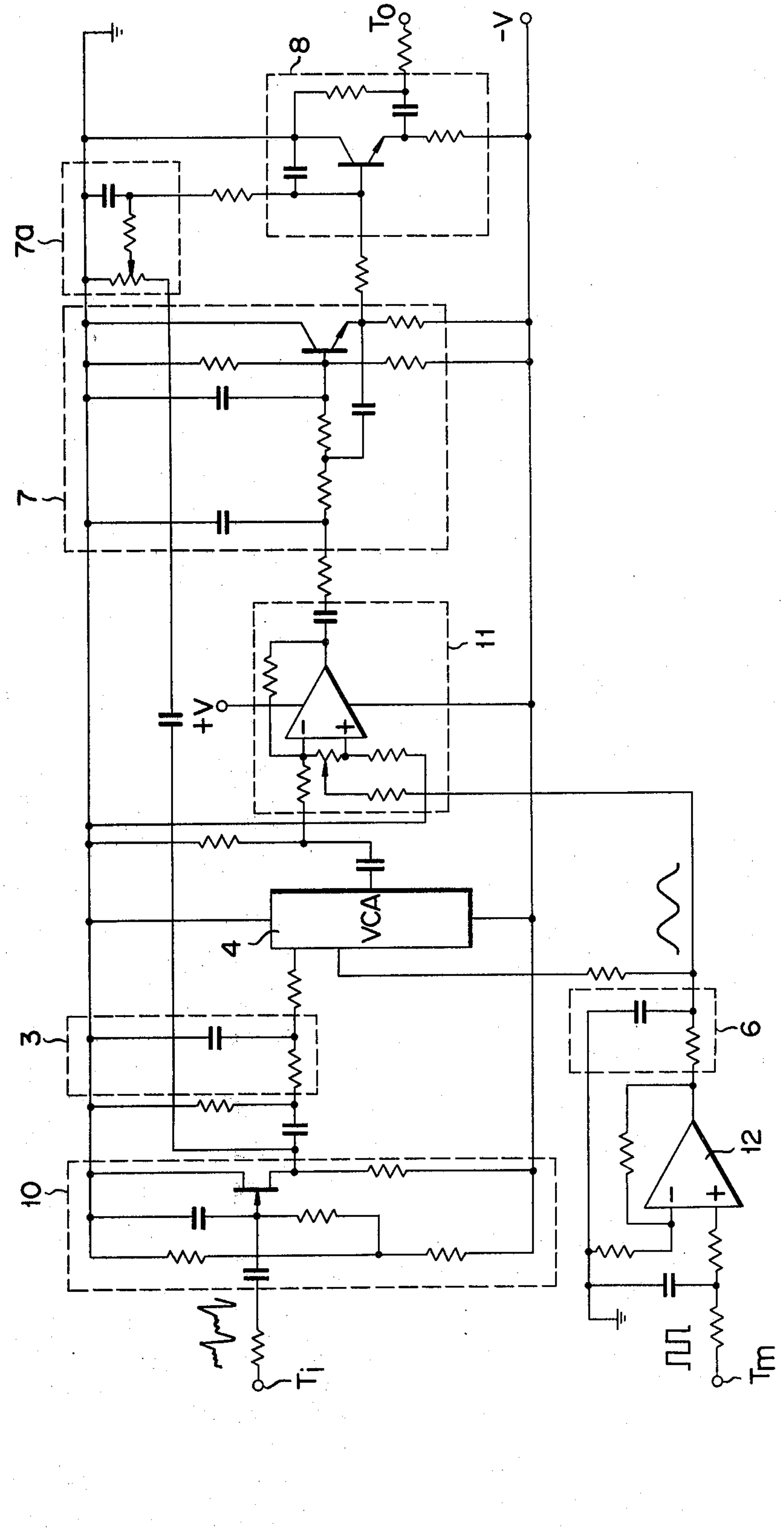
FIG. 5 shows a circuit arrangement corresponding to the arrangement of FIG. 4.

FIG. 5 shows a practical circuit arrangement corresponding to the arrangement of FIG. 4. The input tone signal applied to the input terminal Ti is fed to lowpass filters 3 and 7*a* through a buffer amplifier 10. The output signal of filter 3 is applied to an input terminal of integrated circuit VCA4. The modulation signal with a rectangular waveform applied to the terminal Tm is applied through a buffer amplifier 12 to the filter 6 where unwanted harmonic components are filtered out. The output modulation signal with substantial sinusoidal waveform from the filter 6 is applied to a control input of VCA4 where the output signal of filter 3 is multiplied by the output signal of filter 6. The output signal of VCA4 is applied to a modulation signal cancel circuit 11 to which the output signal of filter 6 is also applied. The modulation signal cancel circuit 11 is provided to cancel out the modulation signal which leaks out at the output of VCA4 when no input tone signal is applied to VCA4 due to incompleteness of differential characteristic of a differential amplifier in VCA4. The output signal of the modulation signal cancel circuit 11 is applied through the filter 7 to the amplifier 8 to be mixed with the output signal of filter 7*a*.

Figure 6:
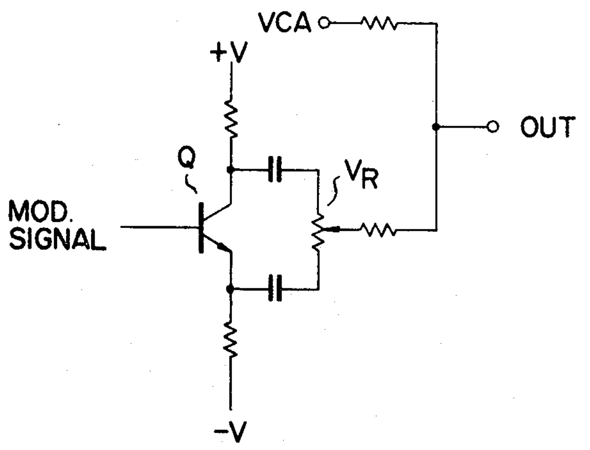
FIGS. 6 and 7 show other embodiments of a modulation signal cancel circuit used in the arrangement of FIG. 5.

FIG. 6 shows another circuit arrangement of a modulation signal cancel circuit 11. In this arrangement, the modulation signal is applied to the base of a transistor Q and the collector output and emitter output of transistor Q which are opposite in polarity to each other are mixed together by means of a variable resistor VR. A slider output of the variable resistor VR and the output of VCA4 are combined to cancel out the modulation signal at the output of VCA4.

Figure 7:
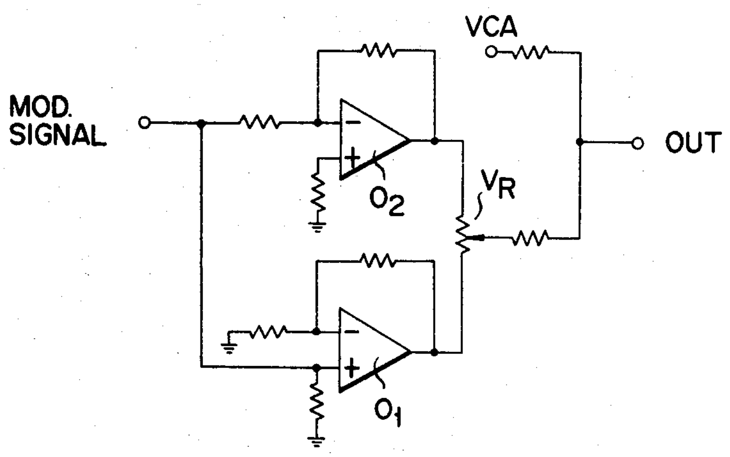

In the arrangement of FIG. 7, a same-phase or in-phase amplifier $O_1$ and an opposite-phase or inverting amplifier $O_2$ are used to produce two modulation signals which are opposite in polarity to each other.

FIG. 8 shows still another embodiment in which, as the modulation signal, the output tone signal of the filter 3 is used. In this embodiment, since the modulation signal is the same as the input signal, the fundamental frequency or lowest frequency of the output tone signal of VCA4 becomes two times the fundamental frequency of the input tone signal to VCA4. A filter 13 connected to the output of amplifier 8 is provided to obtain a desired tone color. In this embodiment, unwanted harmonic components of the modulation signal may be, like the above-mentioned embodiments, eliminated.

In the embodiment of FIG. 9, a sinusoidal modulation signal with a frequency $\frac{1}{2}$fi, half the fundamental frequency fi of the input tone signal, is formed of the input tone signal. An output signal of the buffer amplifier 10 is applied to a filter 14 to produce a sinusoidal signal with a frequency of fi. The sinusoidal output signal of filter 14 is converted by a clipper circuit 15 into a rectangular wave signal which is in turn frequency-divided by a $\frac{1}{2}$ frequency divider or binary counter 16 by a factor of 2. Unwanted harmonic components in the frequency-divided rectangular output of the divider 16 are filtered out by a filter 17 to produce the sinusoidal modulation signal with a frequency of $\frac{1}{2}$fi. It will be evident that the output tone signal at the output terminal To has a fundamental frequency of $\frac{1}{2}$fi.

According to the embodiments shown in FIGS. 8 and 9, the necessity of providing modulation signal sources for the respective tone sources can be obviated. Moreover, the modulation signal cancel circuit is not required.

FIG. 10 shows an embodiment which enables selection of one of one-octave up-conversion, one-octave down-conversion and non-frequency conversion of the input tone signal. A switch $S_1$ is provided to selectively couple output signals of the filters 3 and 6 to the control input of VCA4. When the switch $S_1$ is in the position b as shown, the one-octave down-conversion is performed while, when the switch $S_1$ is switched to the position a the one-octave up-conversion is performed. A switch $S_2$ is adapted to selectively couple the output signal of the filter 7 to the amplifier 8. When the switch $S_2$ is set to the position a as shown, the modulated tone signal is applied to the amplifier 8, while when the switch $S_2$ is switched to the position b the modulated tone signal is not applied to the amplifier 8, but only the input tone signal is applied to the amplifier 8.

In the embodiment of FIG. 11, a plurality of input tone signals which are different from each other in fundamental frequency are applied to VCA4 to which a modulation signal of a predetermined frequency is applied so that octave conversions for the respective tone signals are performed independently with the common modulation signal. For example, a modulation signal of $\frac{1}{2}$fi is applied through the filter 6 to the control input of VCA4 and the input tone signals of fi and $\frac{1}{3}$fi are applied from the input terminals $Ti_1$ and $Ti_2$ to the input of VCA4 through the filters 3 and 3*a*, respectively. The outputs of filters 3 and 3*a* are coupled to the amplifier together with the output of filter 7.

Owing to the multiplication process by fi and $\frac{1}{2}$fi, the frequency components of $\frac{1}{2}$fi, and 3/2fi are produced, while owing to the multiplication process by $\frac{1}{3}$fi and $\frac{1}{2}$fi frequency components of 1/6fi and 5/6fi are produced. When the filter 7 connected between the output of VCA4 and the input of amplifier 8 has its frequency characteristic so selected as to pass only the fundamental components of $\frac{1}{2}$fi and 1/6fi resulting from the respective multiplication processes, one-octave down-converted tone signals appear at the output terminal To which correspond to the input tone signals applied to the input terminals $Ti_1$ and $Ti_2$, respectively.

According to this embodiment, octave conversions for two separate input tone signals are made possible using only one modulation circuit, reducing the number of circuits.

Figure 12:
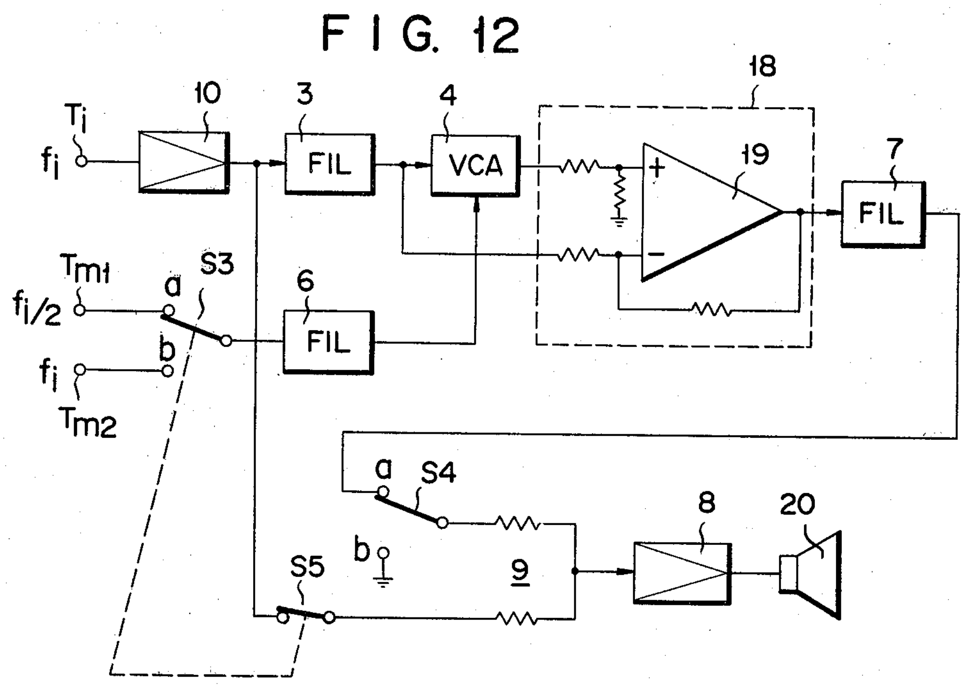

FIG. 12 shows an embodiment which enables frequency conversion over three octaves. With this embodiment, two sources of modulation signals of $\frac{1}{2}$fi and fi are provided for the tone signal of fi. The two modulation signals applied to the modulation input terminals $Tm_1$ and $Tm_2$ are selectively coupled to the control input of VCA4 through the filter 6 by means of an octave change switch $S_3$. When the switch $S_3$ is in the position a as shown, the tone signal of fi applied to the input terminal Ti is one-octave down-converted in VCA4 as described above. When, on the other hand, the switch $S_3$ is switched to the position b, the input tone signal is one-octave up-converted in VCA4 as described above. Particularly when the one-octave up-conversion is effected, the frequency component of fi contained in the output terminal of VCA4 is cancelled out by a tone signal cancel circuit 18 comprised of an operational amplifier 19 responsive to the outputs of filter 3 and VCA4. The output of filter 7 is coupled to the mixer 9 through a switch $S_4$.

When the switch $S_4$ is in the position a as shown, an octave converted tone signal is sounded by a loudspeaker 20 connected to the amplifier 8. To the mixer 9 is coupled the output signal of buffer amplifier 10 through a switch $S_5$ which is so ganged with the switch $S_3$ as to open when the modulation signal of fi is coupled to VCA4 through the switch $S_3$. As a result, when the one-octave up-conversion is effected the tone signal of fi is not coupled to the mixer 9. When the switch $S_4$ is switched to the position b with the switch $S_5$ closed, the original tone signal is sounded through the loudspeaker 20.

Figure 13:
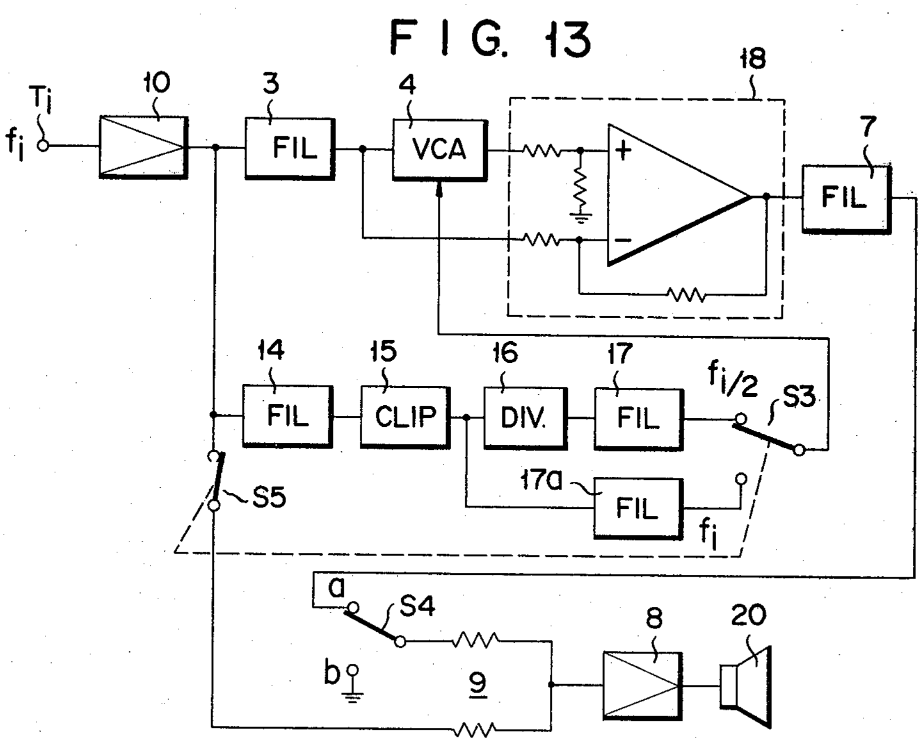

In the embodiment of FIG. 13, the modulation signals of ½fi and fi are formed of the tone signal of fi. Like the embodiment shown in FIG. 9, the modulation signal of ½fi is produced by filter 14, clipper circuit 15, ½ frequency divider 16 and filter 17. The modulation signal of fi can be produced by eliminating unwanted harmonic components of the output signal of the clipper circuit 15 by means of a filter 17*a*. Alternatively, the output signal of the filter 14 may be used as the modulation signal of fi. The two modulation signals are selectively coupled, like the embodiment of FIG. 12, to VCA4 by the switch $S_3$.

Figure 14:
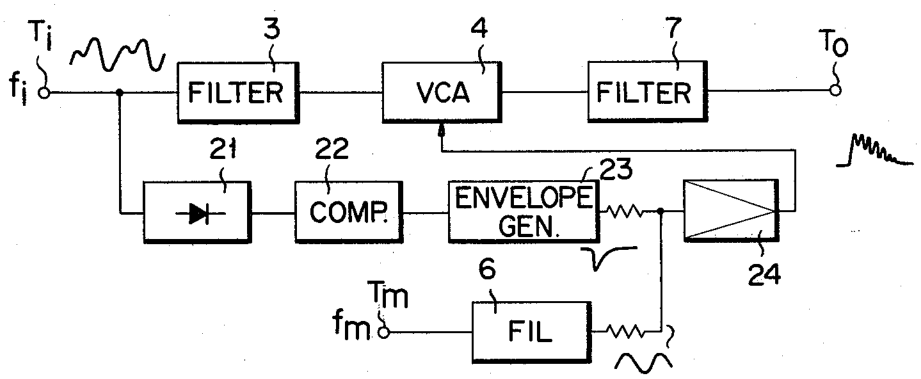

FIG. 14 shows an embodiment which enables envelopes of the fundamental component and of at least a part of overtone components in the downwardly frequency-converted tone signal to be made different from each other. In general, with a sound resulting from mechanical vibration, the decay time of the envelope of overtones is shorter than that of the envelope of the fundamental tone. Accordingly, it is desired that, in the octave conversion, too, the decay time of overtones be made shorter than that of the fundamental tone.

In FIG. 14, the original tone signal is applied also to a rectifier circuit 21 whose output voltage level is compared with a threshold voltage level by a comparator 22. When the rectified output voltage level exceeds the threshold voltage level, the comparator 22 produces an output signal which causes an envelope generator 23 to generate an envelope signal. The envelope signal has such an waveform as to rise rapidly and then decay exponentially. The decay time of the envelope signal is selected to be shorter than that of the envelope of the original tone signal. The initial amplitude of the envelope signal may be larger than that of the original tone signal. The envelope signal is mixed with the modulation signal and then coupled to the control input of VCA4 through an amplifier 24. Accordingly, the bias voltage at the control input of VCA4 varies with the waveshape of the envelope signal. As will be evident from equation (1), the overtone component or components in the frequency-converted tone signal which correspond to sin 2πfit in equation (1) have an amplitude dependent on the bias voltage so that the overtone component decays in accordance with the waveshape of the envelope signal.

Figure 15:
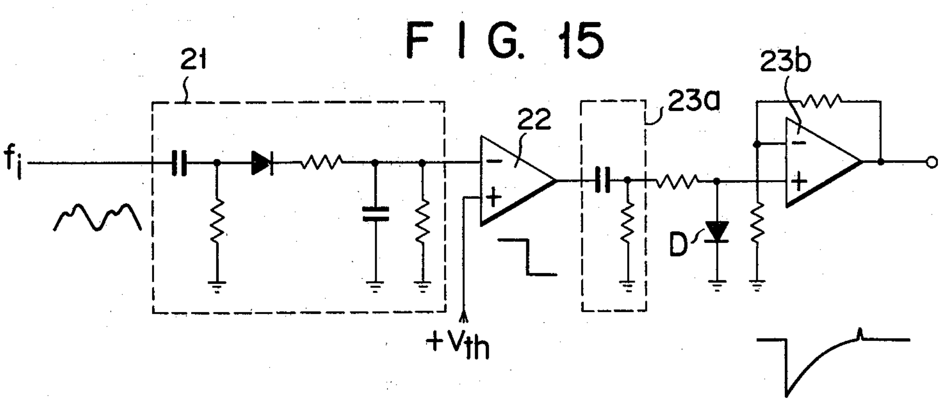
FIG. 15 shows an example of the circuit arrangement of an envelope signal generating section of FIG. 14.

FIG. 15 shows an example of a circuit arrangement of the rectifier circuit 21, comparator 22 and envelope generator 23 of FIG. 14. When the output voltage level of the rectifier circuit 21 exceeds the threshold voltage level +Vth, the comparator or operational amplifier 22 renders its output to go low at once. A differentiator circuit 23*a* is responsive to the negative-going output voltage change at comparator 22 to produce a negative-going differentiated pulse or envelope signal which is in turn amplified by an operational amplifier 23*b*. A diode D is provided to shunt a positive-going differentiated pulse produced by the differentiator circuit 23*a* to ground.

Figure 16A:
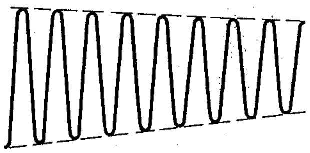
FIGS. 16A to 16C show signal waveforms useful in understanding the operation of the embodiment of FIG. 14.
Figure 16C:
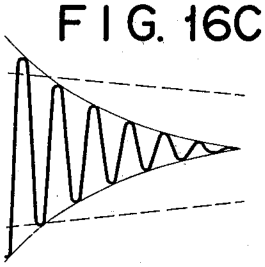
Figure 16B:
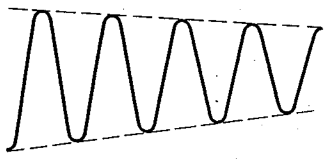

FIG. 16A shows a waveform of the fundamental wave component of an original tone signal and FIG. 16B shows a waveform of the fundamental waveform component after octave conversion. FIG. 16C shows the waveform of a part of the overtone components after octave conversion. As will be evident from FIG. 16C, according to the embodiment of FIG. 14, the overtone contained in the octave-converted tone signal has a relatively large amplitude at rise time and decays faster than the fundamental tone with the result that the attack sense of a sound being generated at rise time is enhanced, forming a more natural tone color.

The frequency conversion system of this invention is preferably applied to electrical pianos, but is not limited thereto. The embodiments in which the modulation signal is formed of an electrically picked up tone signal can be applied to ordinary musical instruments such as string instruments, wind instruments and percussion instruments provided that a suitable electrical pick-up is attached thereto. With the frequency conversion system of this invention, the inherent compasses of musical instruments can be easily extended.

What is claimed is:

1. A frequency conversion system for converting a tone signal in octave, comprising:
   - a multiplier having first and second inputs and an output for providing an output signal at said output which is representative of the product of input signals at said first and second inputs;
   - first means for coupling to said first input of said multiplier a first tone signal having a first fundamental frequency fi and a frequency spectrum of a musical instrument, said tone signal being obtained by electrically picking up mechanical vibrations of a tone source in a musical instrument; and
   - second means for coupling to said second input of said multiplier a substantially sinusoidal modulation signal having a second fundamental frequency in a preselected fixed relation to the fundamental frequency fi of said first tone signal, said modulation signal being obtained from said mechanical vibrations by means which extract said first fundamental frequency from said mechanical vibrations and convert said first fundamental frequency to a sinusoidal wave of said second fundamental frequency,
   - whereby the output signal obtained at the output of said multiplier has a fundamental frequency of m/nfi (m, n=natural numbers).

2. The frequency conversion system according to claim 1 wherein said multiplier is a voltage-controlled amplifier.

3. The frequency conversion system according to claim 1 further comprising means for combining said first tone signal having said fundamental frequency of fi and the output signal of said multiplier.

4. The frequency conversion system according to claim 1 wherein the modulation signal has a frequency of substantially fi.

5. The frequency conversion system according to claim 1 wherein the modulation signal has a frequency of substantially $\frac{1}{2}$fi.

6. The frequency conversion system according to claim 1 further comprising third means for coupling to said first input of said multiplier a second tone signal having a fundamental frequency in a preselected relation to the fundamental frequency fi of said first tone signal.

7. The frequency conversion system according to claim 1 wherein the modulation signal has a frequency of $\frac{1}{2}$fi and further comprising third means for coupling to said first input of said multiplier a second tone signal having a fundamental frequency of $\frac{1}{3}$fi.

8. The frequency conversion system according to claim 1 wherein said second means comprises means for selectively coupling to said second input of said multiplier first and second modulation signals having different frequencies which are in preselected relations to said first fundamental frequency fi.

9. The frequency conversion system according to claim 8 wherein the frequencies of the first and second modulation signals are fi and $\frac{1}{2}$fi, respectively.

10. The frequency conversion system according to claim 1 wherein said second means comprises means connected to receive said first tone signal for producing a substantially sinusoidal modulation signal having a frequency of $\frac{1}{2}$fi.

11. The frequency conversion system according to claim 1 wherein said second means comprises means connected to receive said first tone signal for producing a substantially sinusoidal modulation signal having a frequency of fi.

12. The frequency conversion system according to claim 1 wherein said first and second means each include a filter circuit.

13. The frequency conversion system according to claim 1 further comprising a filter circuit connected to said output of said multiplier.

14. The frequency conversion system according to claim 1 wherein said multiplier is a voltage-controlled amplifier providing said output signal having a component having a frequency of fi and further comprising circuit means for eliminating said component having said frequency of fi contained in said output signal of said voltage-controlled amplifier.

15. The frequency conversion system according to claim 1 wherein said multiplier is a voltage-controlled amplifier having an output at which appears a signal containing the modulation signal, and further including circuit means connected to said output of said multiplier for eliminating the modulation signal appearing at said output of said voltage-controlled amplifier when no tone signal is coupled to said first input of said multiplier.

16. The frequency conversion system according to claim 1 wherein said multiplier is a voltage-controlled amplifier having a main input receiving said first tone signal and a control input receiving said modulation signal having a frequency lower than the fundamental frequency fi of the audible tone signal so that the voltage-controlled amplifier produces an output signal having a fundamental frequency lower than the frequency fi, and further comprising circuit means connected to receive said first tone signal for producing an envelope signal which decays faster than the envelope of said first tone signal, said envelope signal being imparted to said modulation signal, whereby an envelope of at least a part of harmonic components of said output signal decays faster than an envelope of a component corresponding to the fundamental frequency of the output signal.

* * * * *